US012813026B2

(12) United States Patent
Meng et al.

(10) Patent No.: US 12,813,026 B2
(45) Date of Patent: Nov. 24, 2026

(54) LIGHT-EMITTING DIODE, LIGHT-EMITTING DEVICE INCLUDING THE SAME, AND METHOD FOR MANUFACTURING LIGHT-EMITTING DIODE

(71) Applicant: TIANJIN SANAN OPTOELECTRONICS CO., LTD., Tianjin (CN)

(72) Inventors: Cheng Meng, Tianjin (CN); Dongmei Cao, Tianjin (CN); Weihuan Li, Tianjin (CN); Huan-Shao Kuo, Tianjin (CN); Duxiang Wang, Tianjin (CN)

(73) Assignee: TIANJIN SANAN OPTOELECTRONICS CO., LTD., Tianjin (CN)

( * ) Notice: Subject to any disclaimer, the term of this patent is extended or adjusted under 35 U.S.C. 154(b) by 459 days.

(21) Appl. No.: 18/494,075

(22) Filed: Oct. 25, 2023

(65) Prior Publication Data

US 2024/0154069 A1 May 9, 2024

(30) Foreign Application Priority Data

Oct. 27, 2022 (CN) ......................... 202211329778.8

(51) Int. Cl.
*H10H 20/832* (2025.01)
*H10H 20/01* (2025.01)
*H10H 20/824* (2025.01)

(52) U.S. Cl.
CPC ........ *H10H 20/832* (2025.01); *H10H 20/013* (2025.01); *H10H 20/824* (2025.01); *H10H 20/032* (2025.01)

(58) Field of Classification Search
CPC .. H10H 20/013; H10H 20/833; H10H 20/018; H10H 20/824; H10H 20/831;
(Continued)

(56) References Cited

U.S. PATENT DOCUMENTS

2003/0059972 A1* 3/2003 Ikeda .................. H10H 20/831
438/93
2004/0090179 A1* 5/2004 Lin .................... H10H 20/8312
313/506

(Continued)

*Primary Examiner* — Mouloucoulaye Inoussa
(74) *Attorney, Agent, or Firm* — MUNCY, GEISSLER, OLDS & LOWE, P.C.

(57) ABSTRACT

A light-emitting diode includes an epitaxial structure and a first metal electrode. The epitaxial structure has a first surface and a second surface opposite thereto, and includes a first-type semiconductor layer, a light-emitting layer and a second-type semiconductor layer. The first-type semiconductor layer includes an ohmic contact layer which at least partially defines the first surface. The first metal electrode is disposed on the first surface, and includes a main electrode and auxiliary electrodes which are disposed on and electrically connected to the ohmic contact layer. The ohmic contact layer is made of $Al_xGa_yInP$, where $0 \le x \le 1$ or $0 \le y \le 1$. In a top view of the light-emitting layer, a projection of each auxiliary electrode on the first surface is smaller than or equal to that of the ohmic contact layer on the first surface. A light-emitting divide including the light-emitting diode, and a method for manufacturing the light-emitting diode are also provided.

21 Claims, 5 Drawing Sheets

(58) Field of Classification Search
CPC .. H10H 20/835; H10H 20/832; H10H 20/032; H10H 20/82; H10H 20/8316; H10H 20/84; H10H 20/0363; H10H 20/0364; H10H 20/841; H10H 20/819; H10H 20/853; H10H 20/825; H10H 20/8312; H10H 20/857; H10H 29/10; H10H 29/142; H10H 20/813; H10H 20/8314; H10D 62/115; H10W 90/756
See application file for complete search history.

(56) References Cited

U.S. PATENT DOCUMENTS

| | | | | |
|---|---|---|---|---|
| 2005/0208770 | A1* | 9/2005 | Chiba | H01S 5/2231 438/700 |
| 2008/0093612 | A1* | 4/2008 | Konno | H10H 20/82 257/E33.068 |
| 2008/0093619 | A1* | 4/2008 | Konno | H10H 20/816 257/E33.068 |
| 2008/0230791 | A1* | 9/2008 | Lin | H10H 20/8312 257/E33.065 |
| 2008/0283819 | A1* | 11/2008 | Konno | H10H 20/018 257/13 |
| 2009/0108286 | A1* | 4/2009 | Lin | H10H 20/819 257/E33.026 |
| 2009/0206354 | A1* | 8/2009 | Kitano | H10H 20/835 257/98 |
| 2009/0275154 | A1* | 11/2009 | Suzuki | H10H 20/82 257/E21.214 |
| 2010/0065867 | A1* | 3/2010 | Unno | H10H 20/8316 257/E33.068 |
| 2010/0308355 | A1* | 12/2010 | Hsieh | H10H 20/8582 257/98 |
| 2011/0108879 | A1* | 5/2011 | Huang | H10H 20/821 257/E33.066 |
| 2012/0273793 | A1* | 11/2012 | Nishikawa | H10H 20/816 257/98 |
| 2014/0209960 | A1* | 7/2014 | Park | H10H 20/8316 257/99 |
| 2015/0137159 | A1* | 5/2015 | Jeong | H10H 20/835 257/98 |
| 2015/0236204 | A1* | 8/2015 | Wang | H10H 20/835 438/22 |
| 2015/0295135 | A1* | 10/2015 | Park | H10H 20/831 257/98 |
| 2015/0349220 | A1* | 12/2015 | Moon | H10H 20/831 257/98 |
| 2017/0012171 | A1* | 1/2017 | Ko | H10H 20/812 |
| 2017/0125638 | A1* | 5/2017 | Yum | H10H 20/835 |
| 2018/0026162 | A1* | 1/2018 | Seong | H10H 20/835 257/13 |
| 2018/0033918 | A1* | 2/2018 | Lin | H10H 20/82 |
| 2018/0331151 | A1* | 11/2018 | Yang | H10H 29/10 |
| 2019/0027648 | A1* | 1/2019 | Meng | H10H 20/831 |
| 2019/0081213 | A1* | 3/2019 | Chang | H10H 20/824 |
| 2019/0115502 | A1* | 4/2019 | Ito | H10H 20/833 |
| 2019/0123237 | A1* | 4/2019 | Sakong | H10H 20/8215 |
| 2019/0131496 | A1* | 5/2019 | Lin | H10H 20/831 |
| 2019/0148601 | A1* | 5/2019 | Park | H10H 20/8312 257/88 |
| 2020/0119230 | A1* | 4/2020 | Ito | H10H 20/831 |
| 2020/0381589 | A1* | 12/2020 | Yamamoto | H10H 20/013 |
| 2022/0294186 | A1* | 9/2022 | Choi | H01S 5/2059 |
| 2022/0384688 | A1* | 12/2022 | Sheng | H10H 20/825 |
| 2023/0327041 | A1* | 10/2023 | Pitts | H10F 77/147 257/186 |

* cited by examiner

LIGHT-EMITTING DIODE, LIGHT-EMITTING DEVICE INCLUDING THE SAME, AND METHOD FOR MANUFACTURING LIGHT-EMITTING DIODE

CROSS-REFERENCE TO RELATED APPLICATION

This application claims priority to Chinese Invention Patent Application No. 202211329778.8, filed on Oct. 27, 2022, and incorporated by reference herein in its entirety.

FIELD

The present disclosure relates to a light-emitting diode, and a light-emitting device including the same. The present disclosure also relates to a method for manufacturing the light-emitting diode.

BACKGROUND

A light-emitting diode (LED) is a semiconductor light-emitting element typically made of a binary semiconductor compound, e.g., GaN, GaAs, GaP, etc., a ternary semiconductor compound, e.g., AlGaAs, etc., or a quaternary semiconductor compound, e.g., $Al_xGa_yInP$, etc., and includes a core of a p-n junction, in which electrons from the n-type region are injected into the p-type region while holes from the p-type region are injected into the n-type region, and recombination of the electrons and the holes causes the LED to emit light. The LEDs have several advantages such as high luminescence intensity, high efficiency, small size, long service life, etc., and are widely used in various fields.

GaAs crystals are capable of forming good metal-semiconductor ohmic contact, and at present, are widely used as a material for forming an ohmic contact layer in a conventional LED. Since the GaAs material in such conventional LED has an intrinsic absorption wavelength of 860 nm, much of the light in a red light wavelength band, a yellow light wavelength band and a green light wavelength band emitted by the LED was absorbed. In order to reduce light absorption and to ensure voltage regulation, the main electrode and the auxiliary electrodes of the conventional LED are usually disposed in recess portions of semiconductor components positioned underneath, and each of the auxiliary electrodes is usually formed as a metal electrode 300 which encapsulates an ohmic contact layer 21*a* made of GaAs material, as shown in FIG. 1. Since the metal electrode 300 exhibits light shielding effect, the metal electrode 300 is made to have a size as small as possible, causing the conventional LED to have a forward voltage output that is unstable due to chip deformation and alignment deviation. Therefore, those skilled in the art endeavor to optimize the design of the ohmic contact layer and the metal electrode coordinated therewith, so as to solve the problems of poor manufacturing technique and insufficient luminescence of the conventional LED.

SUMMARY

Therefore, an object of the present disclosure is to provide a light-emitting diode, a light-emitting device including the same, and method for manufacturing the light-emitting diode that can alleviate at least one of the drawbacks of the prior art.

According to an aspect of the present disclosure, a light-emitting diode includes an epitaxial structure and a first metal electrode.

The epitaxial structure has a first surface and a second surface opposite to the first surface, and includes, along a direction from the first surface to the second surface, a first-type semiconductor layer, a light-emitting layer and a second-type semiconductor layer in such order. The first-type semiconductor layer includes an ohmic contact layer which at least partially defines the first surface of the epitaxial structure.

The first metal electrode is disposed on the first surface of the epitaxial structure, and includes a main electrode and a plurality of auxiliary electrodes. The auxiliary electrodes are disposed on the ohmic contact layer opposite to the light-emitting layer and are electrically connected to the ohmic contact layer.

The ohmic contact layer is made of an indium phosphide-based material of $Al_xGa_yInP$, where $0 \leq x \leq 1$ or $0 \leq y \leq 1$. In a top view of the light-emitting layer, a projection of each of the auxiliary electrodes on the first surface is smaller than or equal to a projection of the ohmic contact layer on the first surface.

According to another aspect of the present disclosure, a light-emitting device includes the aforesaid light-emitting diode.

According to still another aspect of the present disclosure, a method for manufacturing a light-emitting diode includes:

- sequentially forming a light-emitting layer and a second-type semiconductor layer on a first-type semiconductor layer, so as to obtain an epitaxial structure having a first surface and a second surface opposite to the first surface, the first-type semiconductor layer including an ohmic contact layer which at least partially defines the first surface of the epitaxial structure;
- forming a main electrode on the first surface of the epitaxial structure; and forming a plurality of auxiliary electrodes on the ohmic contact layer.

The ohmic contact ohmic contact layer is made of an indium phosphide-based material of $Al_xGa_yInP$, where $0 \leq x \leq 1$ or $0 \leq y \leq 1$. In a top view of the light-emitting layer, a projection of each of the auxiliary electrodes on the first surface is smaller than or equal to projection of the ohmic contact layer on the first surface.

BRIEF DESCRIPTION OF THE DRAWINGS

Other features and advantages of the present disclosure will become apparent in the following detailed description of the embodiment(s) with reference to the accompanying drawings. It is noted that various features may not be drawn to scale.

DETAILED DESCRIPTION

Figure 1:
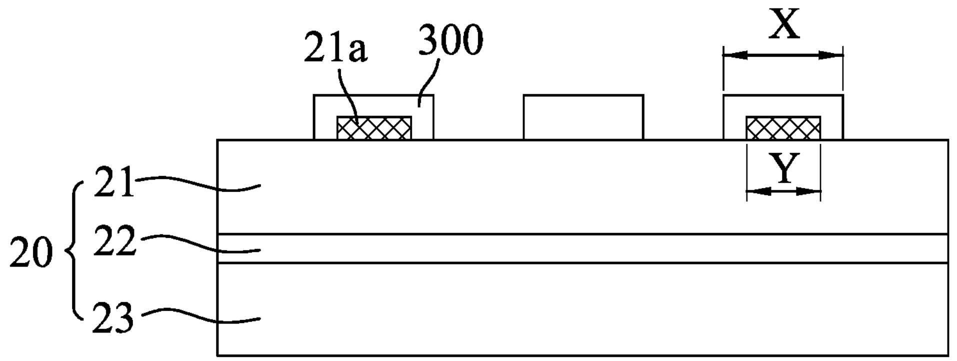
FIG.1 PRIOR ART
FIG. 1 is a schematic sectional view illustrating a conventional light-emitting diode (LED) in which an ohmic contact layer is encapsulated by a metal electrode.

Before the present disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
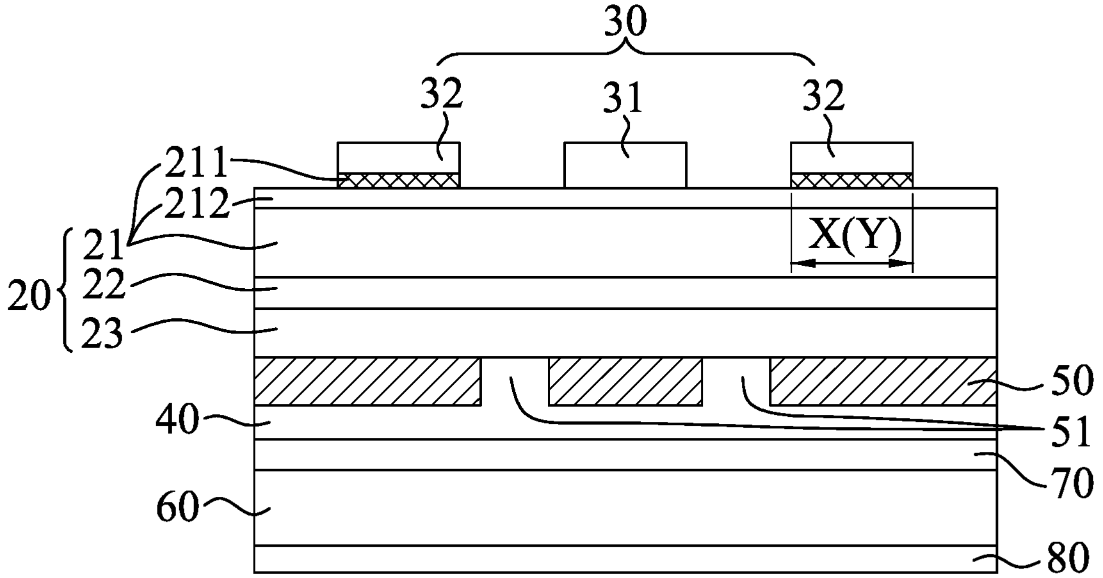
FIG. 2 is a schematic sectional view illustrating an embodiment of an LED according to the present disclosure.

Referring to FIG. 2, an embodiment of a light-emitting diode (LED) according to the present disclosure includes an epitaxial structure 20 and a first metal electrode 30.

Figure 9:
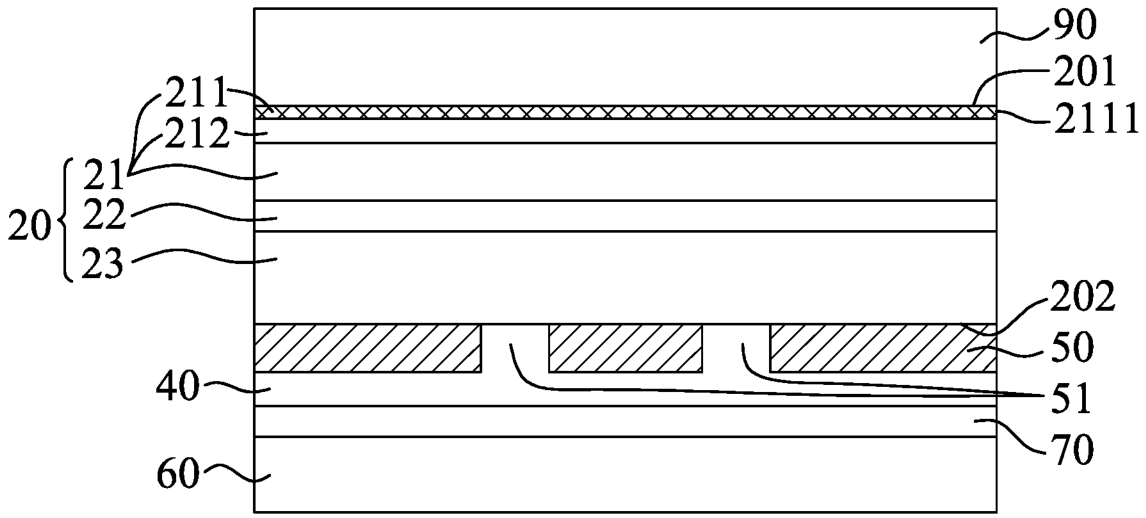

The epitaxial structure 20 has a first surface 201 and a second surface 202 opposite to the first surface 201 (see FIG. 9). The epitaxial structure 20 includes, along a direction from the first surface 201 to the second surface 202, a first-type semiconductor layer 21, a light-emitting layer 22, and a second-type semiconductor layer 23 in such order.

The first-type semiconductor layer 21 and the second-type semiconductor layer 23 are semiconductor components with different conductivity types, electrical properties, and electrical polarities. For example, the first-type semiconductor layer 21 may be one of n-type and p-type, and the second-type semiconductor layer 23 is the other one of n-type and p-type. The first-type semiconductor layer 21 and the second-type semiconductor layer 23 may be doped with different elements to provide electrons or holes, which recombine in the light-emitting layer 22 under a current drive, so that electrical energy is converted into light energy to emit light. In this embodiment, the first-type semiconductor layer 21 is n-type and the second-type semiconductor layer 23 is p-type.

The light-emitting layer 22 is a region where electrons and holes recombine so that the LED emits light, and may be formed as a single heterostructure, a double heterostructure, a double-sided double heterostructure, single-quantum-well structure, or a multi-quantum-well structure. In certain embodiments, the light-emitting layer 22 is formed as a multi-quantum-well structure including a plurality of alternately stacked well layers and barrier layers, in which the barrier layers each has a band gap greater than that of each of the well layers. In certain embodiments, the light-emitting layer 22 is formed as a single-quantum-well structure including a well layer and a barrier layer, in which the barrier layer has a band gap greater than that of the well layer. In this embodiment, the light-emitting layer 22 is formed as a multi-quantum-well structure including a plurality of alternately stacked well layers and barrier layers, in which the barrier layers each has a band gap greater than that of each of the well layers. A wavelength of light emitted by the LED may be altered by changing the composition of the semiconductor material of the light-emitting layer 22 or by adjusting the composition ratio of the semiconductor material thereof. The light-emitting layer 22 may be made of a semiconductor material capable of providing electroluminescence, such as AlGaInP or AlGaAs. In certain embodiments, a light emitted by the LED may have a wavelength ranging from 550 nm to 750 nm, which is within the range of wavelengths of a red light, a yellow light and an orange light. In this embodiment, the light-emitting layer 22 is made of AlGaInP, so that the LED emits a red light having a wavelength ranging from 620 nm to 760 nm.

Referring again to FIG. 2, the first-type semiconductor layer 21 includes an ohmic contact layer 211 which partially defines the first surface 201 of the epitaxial structure 20. To be specific, the first surface 201 of the epitaxial structure 20 has a first portion defined by the ohmic contact layer 211, and a second portion not covered by the ohmic contact layer 211. The ohmic contact layer 211 may be made of an indium phosphide (InP)-based material such as AlGaInP (having an intrinsic absorption wavelength ranging from 490 nm to 650 nm), AlInP (having an intrinsic absorption wavelength of 490 nm), GaInP (having an intrinsic absorption wavelength of 650 nm), or other materials having a relatively short intrinsic absorption wavelength, such that absorption of light by the ohmic contact layer 211 in an LED emitting near-infrared light is greatly reduced, thereby effectively enhance the luminescence of the LED. In certain embodiments, when the LED is an LED plant light, the ohmic contact layer 211 is made of AlGaInP or AlInP. In this embodiment, the ohmic contact layer 211 is made of $Al_xGa_yInP$, where $0 \leq x \leq 1$ or $0 \leq y \leq 1$. It should be noted that the amount of the elements in $Al_xGa_yInP$ may be adjusted according to different practical requirements, such as matching the lattice constant of a temporary substrate 90 (to be described hereinafter) and altering the main wavelength, and are not limited to those described herein. In certain embodiments, the ohmic contact layer 211 includes nickel.

Figure 4:
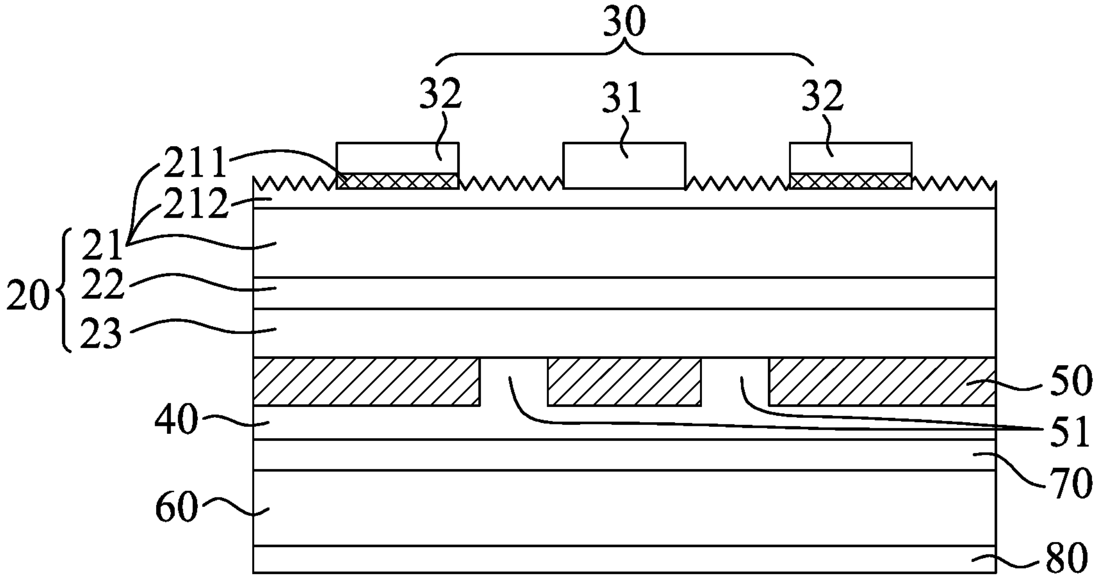
FIG. 4 is a schematic sectional view illustrating yet another embodiment of the LED in which a main electrode of the first metal electrode is formed on the first surface of the epitaxial structure which is not covered by the first ohmic contact layer.
Figure 5:
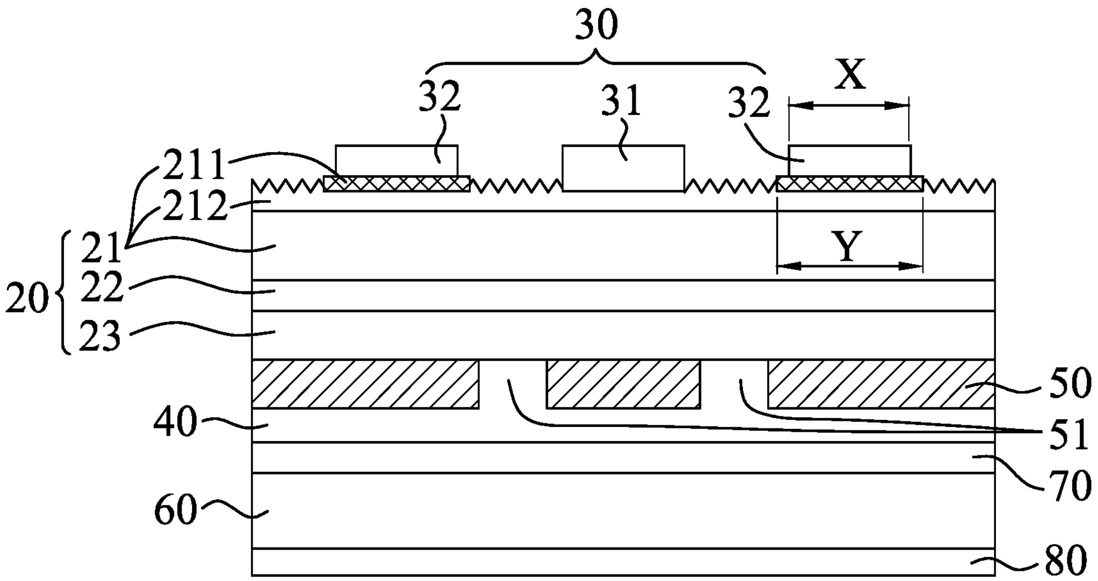
FIG. 5 is a schematic sectional view illustrating a projection of each of auxiliary electrodes on the first surface of the epitaxial structure being smaller than a projection of the ohmic contact layer on the first surface of the epitaxial structure.

The LED further includes a first metal electrode 30 formed on the first surface 201 of the epitaxial structure 20. The first metal electrode 30 includes a main electrode 31 and a plurality of auxiliary electrodes 32. The auxiliary electrodes 32 are formed on the ohmic contact layer 211 opposite to the light-emitting layer 22, and are electrically connected to the ohmic contact layer 211. With reference to FIGS. 2, 4 and 5, the main electrode 31 is formed on the second portion of the first surface 201 of the epitaxial structure 20, i.e., the main electrode 31 is formed on the first surface 201 that is not covered by the ohmic contact layer 211, while each of the auxiliary electrodes 32 is formed on the first portion of the first surface 201 of the epitaxial structure 20 which is defined by the ohmic contact layer 211.

Figure 3:
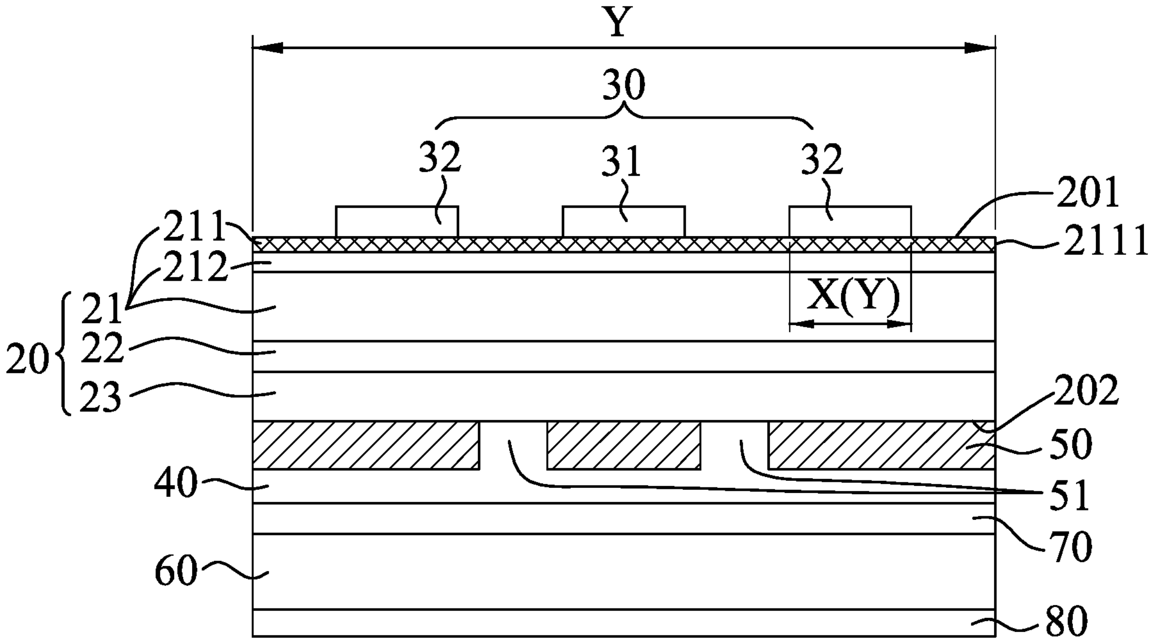
FIG. 3 is a schematic sectional view illustrating another embodiment of the LED in which a first surface of an epitaxial structure is entirely covered by a first ohmic contact layer.

Referring to FIG. 3, in certain embodiments, the first surface 201 of the epitaxial structure 20 is entirely covered by the ohmic contact layer 211, such that the main electrode 31 and the auxiliary electrodes 32 are formed on the ohmic contact layer 211 that defines the first surface 201 of the epitaxial structure 20.

As shown in FIG. 3, the main electrode 31 is formed on a top surface of the first ohmic contact layer 211 so that the main electrode 31 forms an ohmic contact with the first ohmic contact layer 211. Since an ohmic contact is formed between the ohmic contact layer 211 and the first metal electrode 30, and since the ohmic contact layer 211 is n-type doped and has a relatively high doping concentration, some of the light emitted by the LED will be absorbed. Therefore, in certain embodiments, the ohmic contact layer 211 positioned below the main electrode 31 is removed by an etching process to reduce light absorbance by regions below the main electrode 31, thereby enhancing the luminescence of the LED.

In addition, when the LED of the present disclosure is viewed from top thereof, a projection of each of the auxiliary electrodes 32 on the first surface 201 may be smaller than or equal to a projection of the ohmic contact layer 211 on the first surface 201. As shown in FIGS. 2 and 4, a size of the projection of each of the auxiliary electrodes 32 (X) on the first surface 201 is equal to a size of the projection of the ohmic contact layer 211 (Y) on the first surface 201. As shown in FIG. 3, since the first surface 201 is entirely covered by the ohmic contact layer 211, the size of the projection of the ohmic contact layer 211 (Y) on the first surface 201 is much greater than the size of the projection of each of the auxiliary electrodes 32 (X) on the first surface 201. In addition, as shown in FIG. 5, even if the first surface 201 is not entirely covered by the ohmic contact layer 211, the size of the projection of the ohmic contact layer 211 (Y) on the first surface 201 is still slightly greater than the size of the projection of each of the auxiliary electrodes 32 (X) on the first surface 201. The various embodiments of the LED as shown in FIGS. 2 to 5 revealed that since the ohmic contact layer 211 is made of AlGaInP, light absorption by the ohmic contact layer 211 is reduced, thus, the dimension of the ohmic contact layer 211 can be expanded such that the area of the ohmic contact layer 211 is greater than or equal to the area of each of the auxiliary electrodes 32, thereby increasing the current expansion effect. It should be noted that, depending on actual practice, the dimension of the ohmic contact layer 211 may be flexibly adjusted according to practical requirements such that the size of the projection of the ohmic contact layer 211 (Y) on the first surface 201 may be smaller than the size of the projection of each of the auxiliary electrodes 32 (X) on the first surface 201, as shown in FIG. 1. However, since light absorption by the LED of the present disclosure is reduced due to the ohmic contact layer 211 being made of the aforesaid InP-based material, enlargement of the dimension of the ohmic contact layer 211 is possible without causing the problem of insufficient luminescence of the LED.

In addition, when the projection of the ohmic contact layer 211 on the first surface 201 is the same as that of the first metal electrode 30 on the first surface 201, the area of the first metal electrode 30 is effectively utilized because the size of the light-shielded area of the first metal electrode 30 will be similar to the size of the projection of the ohmic contact layer 211 on the first surface 201, thereby simplifying and reducing the cost of manufacturing the LED, and also eliminates the problem of unstable forward voltage output due to chip deformation and alignment deviation encountered in the conventional LED where the metal electrode encapsulates the ohmic contact layer.

Figure 6:
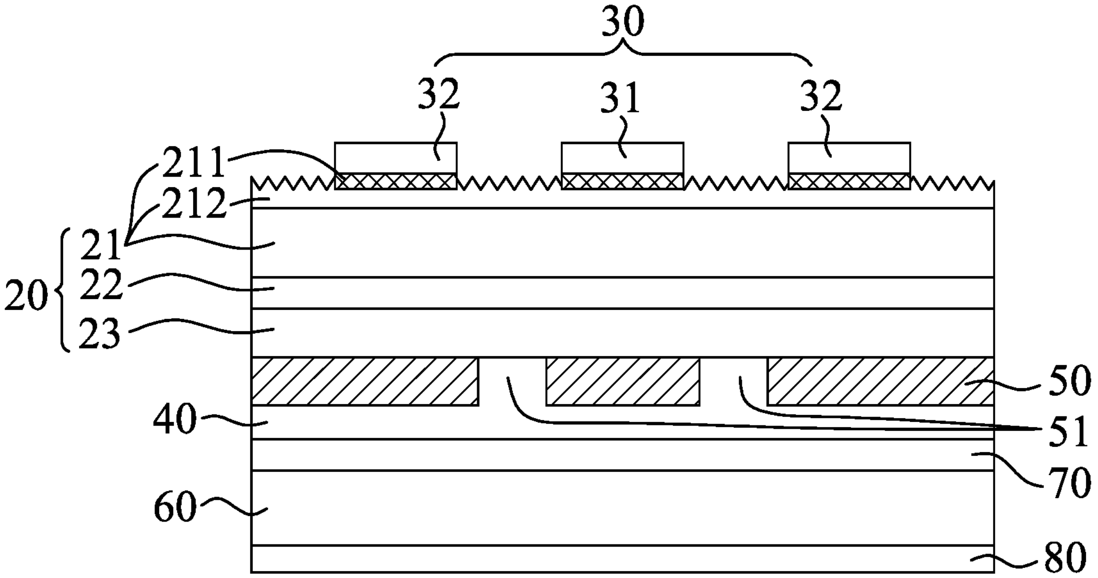
FIG. 6 is a schematic sectional view illustrating still yet another embodiment of the LED in which the main electrode is formed on the ohmic contact layer.

In order to improve light extraction efficiency, when the first surface 201 of the epitaxial structure 20 serves as a light-emitting surface, the first surface 201 may be a smooth surface (i.e., non-roughened surface) as shown in FIGS. 2 and 3, or a roughened surface as shown in FIGS. 4 to 6. The roughened surface may be obtained by subjecting the first surface 201 to random roughening or forming a pattern of repeating features thereon. When the first surface 201 of the epitaxial structure 20 is a roughened surface, the first metal electrode 30 is formed on regions of the first surface 201 of the epitaxial structure 20 which are not roughened.

The main elements of a conventional metal electrode include gold and small amounts of germanium and nickel which are capable of forming a good ohmic contact layer with GaAs. In the LED of the present disclosure, since the ohmic contact layer 211 is made of AlGaInP instead of GaAs, the first metal electrode 30 and the ohmic contact layer 211 form a relatively poor ohmic contact therebetween, as determined experimentally. Therefore, in certain embodiments, the first metal electrode 30 includes at least three metals selected from the group consisting of gold, germanium, nickel, and alloys thereof. In this embodiment, a nickel content of the first metal electrode 30 first increases and then decreases along a direction from a bottom surface of the first metal electrode 30 adjacent to the first surface 201 of the epitaxial structure 20 to a top surface of the first metal electrode 30 opposite to the bottom surface, as determined by energy-dispersive X-ray spectroscopy (results not shown), so that an ohmic contact between the first metal electrode 30 and the first ohmic contact layer 211 that is made of AlGaInP can be easily formed. In certain embodiments, nickel of the first metal electrode 30 diffuses into the ohmic contact layer 21 during melt-fusion of the metals of the first metal electrode 30 on the epitaxial structure 20, so the barrier height of between the first metal electrode 30 and the epitaxial structure 20 is reduced, thereby improving ohmic contact properties therebetween.

The first metal electrode 30 further includes titanium and platinum. To be specific, the presence of platinum enables the first metal electrode 30 to be formed on the epitaxial structure 20 at a relatively low temperature, which is advantageous for a vertically-structured LED that is formed with a reflector unit (i.e., a reflector layer 40 and a current blocking layer 50 to be described hereinafter) and a bonded structure (i.e., a substrate 60 and a bonding layer 70 to be described hereinafter) because low temperature facilitates formation of ohmic contact between the first metal electrode 30 and the epitaxial structure 20.

In certain embodiments, the titanium in the first metal electrode 30 is distributed closer to the ohmic contact layer 211 than the platinum, and the platinum is distributed immediately adjacent to the titanium. The presence of titanium prevents germanium and nickel from diffusing towards the top surface of the first metal electrode 30, such that the germanium and nickel are concentrated at the bottom surface of the first metal electrode 30 to form good ohmic contact with the epitaxial structure 20 which includes the ohmic contact layer 211 made of AlGaInP. In order to ensure germanium and nickel are effectively prevented from diffusing towards the top surface of the first metal electrode 30, in certain embodiments, the titanium in the first metal electrode 30 forms a titanium-containing layer that has a thickness of greater than 800 angstroms (Å) and not greater than 2000 Å.

By adjusting the composition of the first metal electrode 30 as mentioned in the foregoing, the first metal electrode 30 is stably connected to the ohmic contact layer 211 made of AlGaInP, AlInP, GaInP or other materials having a short intrinsic absorption wavelength, and good ohmic contact between the first metal electrode 30 and the ohmic contact layer 211 is formed, thereby obtaining a stable operating voltage.

As shown in FIG. 2, in this embodiment, the first-type semiconductor layer 21 further includes at least one window layer 212 which is disposed on the ohmic contact layer 211 opposite to the first metal electrode 30, and which is made of an InP-based material of $Al_mGa_nInP$, where 0≤m≤1 or 0≤n≤1. The ohmic contact layer 211 has an Al content that is less than an Al content of the window layer 212. In certain embodiments, the Al content in the ohmic contact layer 211 may be equal to the Al content in the window layer 212, and may be flexibly adjusted according to practical requirements. In addition, the composition ratio of AlGaInP of the ohmic contact layer 211 may be the same as the composition ratio of AlGaInP of the window layer 212, and these composition ratios may be flexibly adjusted according to practical requirements.

In certain embodiments, the ohmic contact layer 211 and the window layer 212 of the first-type semiconductor layer 21 are made of AlInP, and the composition ratio of AlInP of the ohmic contact layer 211 may be the same as the composition ratio of AlInP of the window layer 212. Since the ohmic contact layer 211 and the window layer 212 are made of the same InP-based material, the barrier height therebetween is reduced, and the ohmic contact layer 211 and the window layer 212 each has a relatively shorter intrinsic absorption wavelength, thereby enhancing the luminescence of light emitted by the LED and enhancing external quantum efficiency. In addition, since the Al content of the ohmic contact layer 211 is less than that of the window layer 212, the potential difference between the first metal electrode and the epitaxial structure 20 is reduced, resulting in lower impedance to metal-semiconductor contact, and improved ohmic contact between the first metal electrode 30 and the epitaxial structure 20.

In certain embodiments, the ohmic contact layer 211 has a thickness greater than 300 Å which is less than a thickness of the window layer 212. In certain embodiments, the thickness of the window layer 212 is less than 5 μm.

In certain embodiments, each of the ohmic contact layer 211 and the window layer 212 is n-type doped, and a doping concentration of the window layer 212 is lower than that of the ohmic contact layer 211. It should be noted that: the higher the doping concentration of the ohmic contact layer 211 is, the lower the voltage is; and the lower the doping concentration of the window layer 212 is, the lesser the amount of light absorbance by the LED is, which results in the LED having a relatively high luminescence. Therefore, the ohmic contact layer 211 has a relatively high doping concentration so that the ohmic contact layer 211 easily forms an ohmic contact with the first metal electrode 30, and the window layer 212 has a relatively low doping concentration so that LED has a relatively high luminescence. In certain embodiments, the doping concentration of the ohmic contact layer 211 is greater than $4E+18/cm^3$, and the doping concentration of the window layer 212 ranges from $4E+17/cm^3$ to $4E+18/cm^3$.

In certain embodiments, a relation between $Al_xGa_yInP$ and $Al_mGa_nInP$ is m−x≥0.2. In certain embodiments, in $Al_xGa_yInP$ and $Al_mGa_nInP$, m ranges from 0.2 to 1.0, and x ranges from 0 to 0.8.

Referring again to FIGS. 2 to 6, the LED further includes a reflector layer 40, a current blocking layer 50, a substrate 60, and a second metal electrode 80.

The reflector layer 40 is formed on the second surface 202 of the epitaxial structure 20 opposite to the light-emitting layer 22. In certain embodiments, the reflector layer 40 may be a distributed Bragg reflector (DBR) including a plurality of alternately stacked first sublayers and second sublayers, and the each of the first sublayers has a refractive index that is different from that of each of the second sublayers. Each of the first sublayers and the second sublayers of the DBR is made of a dielectric oxide material, such as $TiO_x$, $SiO_x$ or $Al_2O_3$. In certain embodiments, the reflector layer 40 may be an omnidirectional reflector (ODR) including a metallic material, such as Al, Ag, Au, etc., in combination with a DBR or a dielectric oxide layer. The reflector layer 40 may be formed by adding other structures, such as a current spreading layer and a transparent conductive layer, so as to increase luminescence efficiency of the LED.

The current blocking layer 50 is interposed between the second-type semiconductor layer 23 and the reflector layer 40, and has a plurality of through holes 51. The reflector layer 40 is connected to the second-type semiconductor layer 23 via the through holes 51 of the current blocking layer 50. The current blocking layer 50 may be made of at least one of a fluoride material, a nitride material and an oxide material. To be specific, the current blocking layer 50 may be made of at least one of ZnO, $SiO_x$, $SiN_x$, $SiO_xN_y$, $Al_2O_3$, $TiO_x$, MgF, and GaF. In this embodiment, the current blocking layer 50 is made of $SiO_2$. The current blocking layer 50 may include at least one dielectric material layer or a plurality of dielectric material layers with different refractive indexes. In certain embodiments, the current blocking layer 50 may be a light-transmissive dielectric layer, and at least 50% of light can pass therethrough. In certain embodiments, the current blocking layer 50 has a refractive index that is lower than that of the epitaxial structure 20. The current blocking layer 50 and the reflector layer 40 form a reflector unit of the LED, and the reflector unit reflects a light emitted by the epitaxial structure 20 towards the substrate 60 back to the epitaxial structure 20 such that the light is emitted out from the first surface 201 of the epitaxial structure 20, thereby improving light extraction efficiency.

The substrate 60 is disposed on the reflector layer 40 opposite to the epitaxial structure 20. The substrate 60 may be electrically conductive or non-electrically conductive, and may be transparent or non-transparent. In certain embodiments, the substrate 60 is electrically conductive, and may be made of an electrically conductive material selected from the group consisting of GaP, SiC, Si, and GaAs.

The bonding layer 70 is interposed between the reflector layer 40 and the substrate 60. The bonding layer 70 may be made of a transparent conductive oxide material, a metallic material, an insulating oxide material, or a polymeric material. The transparent conductive oxide material is selected from the group consisting of indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium-doped zinc oxide (GZO), tungsten-doped indium oxide (IWO), zinc oxide (ZnO), and indium zinc oxide (IZO). The metallic material is selected from the group consisting of In, Sn, Au, Ti, Ni, Pt, W, and alloys thereof. The insulating oxide material is selected from the group consisting of aluminum oxide ($AlO_x$), silicon oxide ($SiO_x$), and silicon oxynitride ($SiO_xN_y$). The polymeric material is selected from the group consisting of epoxy resin, polyimide, perfluorocyclobutane, benzocyclobutene, and siloxane.

The second metal electrode 80 is formed on the substrate 60 opposite to the bonding layer 70, and with the first metal electrode 30, are used to conduct an electrical current therebetween. The second metal electrode 80 may be made of a metallic material or a transparent conductive material that may include a transparent conductive oxide material. The metallic material of the second metal electrode 80 may be selected from the group consisting of Au, Pt, GeAlNi, Ti, BeAu, GeAu, Al, and ZnAu.

Apart from the aforesaid components of the LED of the present disclosure, those skilled in the art, based on this embodiment of the LED, may add other components to the LED according to practical requirements.

The present disclosure also provides a light-emitting device which includes the aforesaid LED. The light-emitting device may utilize a red light or an infrared light emitted by the LED of the present disclosure for display or illumination purposes, or may be applied in other optical equipment.

Figure 8:
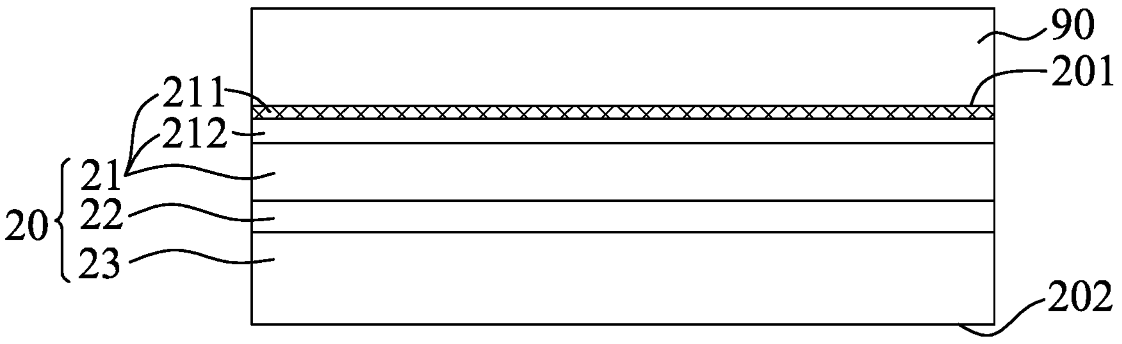
FIGS. 8 to 10 are schematic sectional views respectively illustrating the LED at different stages of an embodiment of a method for manufacturing the LED according to the present disclosure.
Figure 10:
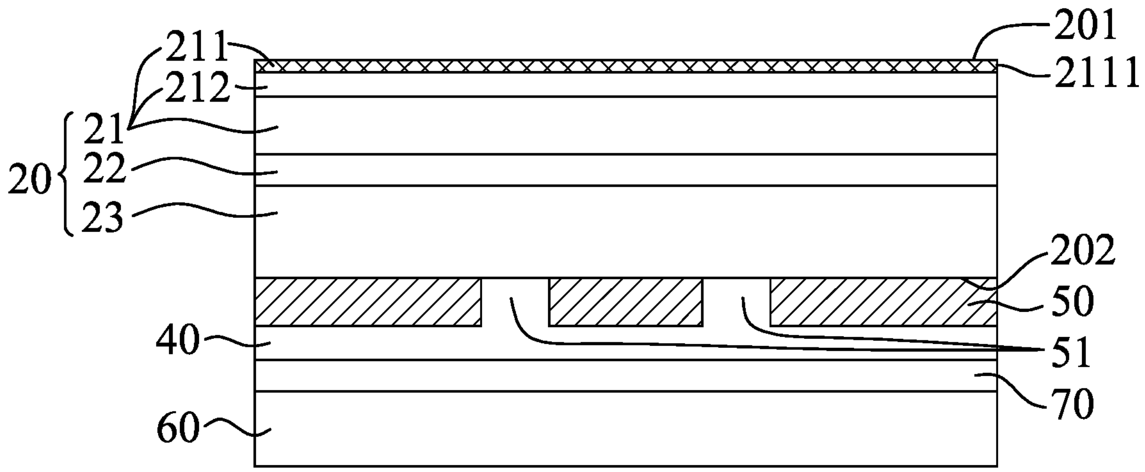

FIGS. 8 to 10 are schematic sectional views respectively showing the LED of the present disclosure at different stages of the manufacturing process.

The present disclosure also provides an embodiment of a method for manufacturing an LED which is described hereinafter.

First, as shown in FIG. 8, the light-emitting layer 22 and the second-type semiconductor layer 23 are sequentially formed on the first-type semiconductor layer 21 so as to obtain the epitaxial structure 20 which has the first surface 201 and the second surface 202 opposite to the first surface 201, and which is formed on a temporary substrate 90. That is, the epitaxial structure 20 includes, from the first surface 201 to the second surface 202, the first-type semiconductor layer 21, the light-emitting layer 22 and the second-type semiconductor layer 23 in such order. The epitaxial structure 20 may be formed on the temporary substrate 90 using techniques well known to those skilled in the art, such as physical vapor deposition, chemical vapor deposition, epitaxial growth, atomic layer deposition, etc. The first-type semiconductor layer 21 includes the ohmic contact layer 211 and the window layer 212. The ohmic contact layer 211 at least partially defines the first surface 201 of the epitaxial structure 20. In certain embodiments, the first surface 201 of the epitaxial structure 20 has a first portion that is covered by the ohmic contact layer 211 and a second portion that is not covered by the ohmic contact layer 211. In certain embodiments, the first surface 201 of the epitaxial structure 20 is completely covered by the ohmic contact layer 211. The ohmic contact layer 211 is made of the InP-based material of $Al_xGa_yInP$, where $0 \le x \le 1$ or $0 \le y \le 1$.

Next, as shown in FIG. 9, the current blocking layer 50 is formed on the second-type semiconductor layer 23 opposite to the light-emitting layer 22. In this embodiment, the current blocking layer 50 is made of $SiO_2$. The current blocking layer 50 is formed with a plurality of the through holes 51 via masking and etching processes, and then the reflector layer 40 is formed on the current blocking layer 50 opposite to the second-type semiconductor layer 23, so as to obtain the reflective unit. Thereafter, the bonding layer 70 is disposed on the current blocking layer 50 so that the substrate 60 is bonded to the reflector layer 40 through the bonding layer 70. Subsequently, the temporary substrate 90 is removed via a wet etching process so as to expose the ohmic contact layer 211, thereby obtaining a structure as shown in FIG. 10.

Afterwards, the main electrode 31 is formed on the portion of the first surface 201 of the epitaxial structure which is defined by the ohmic contact layer 211 (i.e., the main electrode 31 is formed on the ohmic contact layer 211) or on the first surface 201 of the epitaxial structure 20 which is not covered by the ohmic contact layer 211 using techniques well known to those skilled in the art, such as electron gun, sputtering, etc.

Then, the auxiliary electrode 32 are formed on the ohmic contact layer 211 using techniques well known to those skilled in the art, such as electron gun, sputtering, etc. When the LED manufactured by the method of the present disclosure is viewed from top thereof, the projection of each of the auxiliary electrodes 32 on the first surface 201 may be smaller than or equal to the projection of the ohmic contact layer 211 on the first surface 201. The second metal electrode 80 may be simultaneously formed with the first metal electrode 30, and is formed on the substrate 60 opposite to the reflector layer 40, thereby obtaining the LED of the present disclosure (see FIGS. 2 and 3).

In certain embodiments, the first surface 201 of the epitaxial structure 20 may be subjected to random roughening using masking and etching processes. In this embodiment of the method, the first surface 201 of the epitaxial structure 20 is subjected to random roughening by a wet etching process that is conducted using an acidic solution selected from the group consisting of sulfuric acid, phosphoric acid, nitric acid, acetic acid, oxalic acid, and combinations thereof, so that the first surface 201 of the epitaxial structure 20 has a roughened surface (see FIGS. 4 to 6).

In certain embodiments, the first metal electrode 30 is formed by melt-fusion of at least three metals selected from the group consisting of gold, germanium, nickel, and alloys thereof at a high temperature ranging from 380° C. to 520° C. In certain embodiments, the first metal electrode 30 is formed by melt-fusion of at least five metals selected from the group consisting of gold, germanium, nickel, titanium, platinum and alloys thereof at a low temperature ranging from 280° C. to 380° C.

Figure 7:
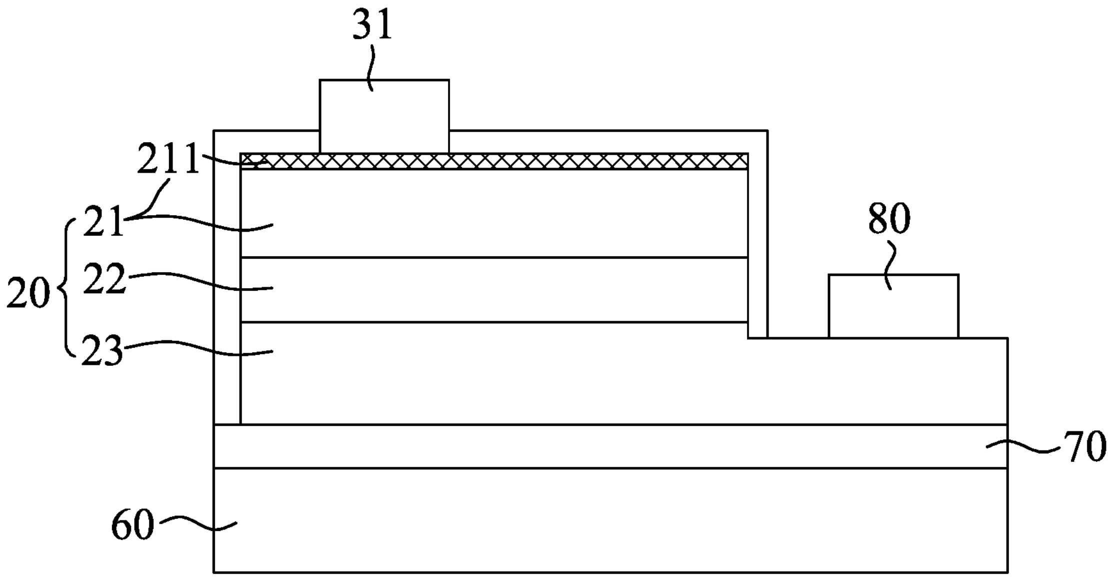
FIG. 7 is a schematic sectional view illustrating a flip-chip LED according to the present disclosure.

It should be noted that, referring to FIG. 7, in the manufacturing process of a horizontal-structured LED, e.g., a flip-chip LED, the first metal electrode 30 and the second metal electrode 80 are formed on the epitaxial structure 20 before the reflector unit (i.e., the reflector layer 40 and the current blocking layer 50) and the bonded structure (i.e., the substrate 60 and the bonding layer 70) are completely formed. To be specific, the first metal electrode 30 and the second metal electrode 80 may be formed on the epitaxial structure 20 by melt-fusion of at least three metals selected from the group consisting of gold, germanium, nickel, and alloys thereof at a relatively high temperature ranging from 380° C. to 520° C.

In contrast, referring to FIGS. 2 to 6, in the manufacturing process of a vertical-structured LED, the reflective unit and the bonded structure are completely formed before the first metal electrode 30 is formed on the epitaxial structure 20 at a high temperature, which may result in damage to the reflective unit and the bonded structure. Therefore, when the LED to be manufactured is a vertical-structured LED, the first metal electrode 30 may be formed on the epitaxial structure 20 by melt-fusion of at least five metals selected from the group consisting of gold, germanium, nickel, titanium, platinum and alloys thereof at a relatively low temperature ranging from 280° C. to 380° C., so as to avoid damage to the reflective unit and the bonded structure.

In summary, by including the ohmic contact layer 211 made of AlGaInP, the LED of the present disclosure exhibits reduced light absorption in comparison with the conventional LED which includes an ohmic contact layer made of GaAs, and thus the problem of poor light extraction efficiency in the conventional LED caused by strong light absorption by the ohmic contact layer made of GaAs is solved, thereby greatly improving the luminescence of the LED. In addition, by having the projection of each of the auxiliary electrodes 32 on the first surface 201 of the epitaxial structure 20 being smaller than or equal to the projection of the ohmic contact layer 211 on the first surface 201 of the epitaxial structure 20, the problem of unstable forward voltage output caused by chip deformation and alignment deviation that occur during the manufacturing process of the conventional LED in which a metal electrode encapsulates an ohmic contact layer can be avoided, thereby improving the reliability of the LED of the present disclosure, and effectively enhances the resistance of the first metal electrode 30 and the second metal electrode 80 to electrochemical corrosion. Moreover, by adjusting the composition of the first metal electrode 30, a good ohmic contact can be formed between the first metal electrode 30 and the ohmic contact layer 211, so that a stable operating voltage can be obtained.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting diode, comprising:

an epitaxial structure having a first surface and a second surface opposite to said first surface, said epitaxial structure including, along a direction from said first surface to said second surface, a first-type semiconductor layer, a light-emitting layer and a second-type semiconductor layer in such order, said first-type semiconductor layer including an ohmic contact layer which at least partially defines said first surface of said epitaxial structure; and a first metal electrode formed on said first surface of said epitaxial structure, and including a main electrode and a plurality of auxiliary electrodes each spaced apart from said main electrode, said plurality of auxiliary electrodes being formed on said ohmic contact layer opposite to said light-emitting layer and being electrically connected to said ohmic contact layer, wherein said ohmic contact layer is made of an indium phosphide-based material of $Al_xGa_yInP$, where 0≤x≤1 or 0≤y≤1, and wherein in a top view of said light-emitting diode, a projection of each of said plurality of auxiliary electrodes on said first surface is smaller than a projection of said ohmic contact layer on said first surface.

2. The light-emitting diode as claimed in claim 1, wherein said ohmic contact layer has a surrounding surface that is not covered by said plurality of auxiliary electrodes.

3. The light-emitting diode as claimed in claim 1, wherein said first surface of said epitaxial structure has a first portion defined by said ohmic contact layer and a second portion not covered by said ohmic contact layer, said main electrode being formed on said first portion of said first surface or on said second portion of said first surface.

4. The light-emitting diode as claimed in claim 1, wherein said first metal electrode includes at least three metals selected from the group consisting of gold, germanium, nickel, and alloys thereof, said first metal electrode having a nickel content that first increases and then decreases along a direction from a bottom surface of said first metal electrode adjacent to said first surface of said epitaxial structure to a top surface of said first metal electrode opposite to said bottom surface.

5. The light-emitting diode as claimed in claim 4, wherein said first metal electrode further includes titanium and platinum, the titanium being distributed closer to said ohmic contact layer than the platinum, the platinum being distributed immediately adjacent to the titanium.

6. The light-emitting diode as claimed in claim 5, wherein the titanium in said first metal electrode forms a titanium-containing layer having a thickness of greater than 800 angstroms (Å).

7. The light-emitting diode as claimed in claim 1, wherein said ohmic contact layer includes nickel.

8. The light-emitting diode as claimed in claim 1, wherein said first-type semiconductor layer further includes at least one window layer which is disposed on said ohmic contact layer opposite to said first metal electrode, and which is made of an indium phosphide-based material of $Al_mGa_nInP$, where 0≤m≤1 or 0≤n≤1, said ohmic contact layer having an Al content that is less than an Al content of said window layer.

9. The light-emitting diode as claimed in claim 8, wherein said ohmic contact layer is n-type doped and has a doping concentration of greater than $4E+18/cm^3$, said window layer being n-type doped and having a doping concentration ranging from $4E+17/cm^3$ to $4E+18/cm^3$.

10. The light-emitting diode as claimed in claim 8, wherein a relation between $Al_xGa_yInP$ and $Al_mGa_nInP$ is m−x≥0.2, where m ranges from 0.2 to 1.0, x ranging from 0 to 0.8.

11. The light-emitting diode as claimed in claim 1, wherein a light emitted by said light-emitting diode has a wavelength ranging from 550 nm to 750 nm.

12. A light-emitting diode, comprising:

an epitaxial structure having a first surface and a second surface opposite to said first surface, said epitaxial structure including, along a direction from said first surface to said second surface, a first-type semiconductor layer, a light-emitting layer and a second-type semiconductor layer in such order, said first-type semiconductor layer including an ohmic contact layer which at least partially defines said first surface of said epitaxial structure; and a first metal electrode formed on said first surface of said epitaxial structure, and including a main electrode and a plurality of auxiliary electrodes each spaced apart from said main electrode, said plurality of auxiliary electrodes being disposed on said ohmic contact layer opposite to said light-emitting layer and being electrically connected to said ohmic contact layer, wherein said ohmic contact layer is made of an indium phosphide-based material of $Al_xGa_yInP$, where $0 \leq x \leq 1$ or $0 \leq y \leq 1$, and wherein said first metal electrode includes at least three metals selected from the group consisting of gold, germanium, nickel, and alloys thereof, said first metal electrode having a nickel content that first increases and then decreases along a direction from a bottom surface of said first metal electrode adjacent to said first surface of said epitaxial structure to a top surface of said first metal electrode opposite to said bottom surface.

13. The light-emitting diode as claimed in claim 12, wherein said first metal electrode further includes titanium and platinum, the titanium being distributed closer to said ohmic contact layer than the platinum, the platinum being distributed immediately adjacent to the titanium.

14. The light-emitting diode as claimed in claim 13, wherein the titanium in said first metal electrode forms a titanium-containing layer having a thickness of greater than 800 angstroms (Å).

15. The light-emitting diode as claimed in claim 12, wherein said ohmic contact layer includes nickel.

16. The light-emitting diode as claimed in claim 12, wherein said first-type semiconductor layer further includes at least one window layer which is disposed on said ohmic contact layer opposite to said first metal electrode, and which is made of an indium phosphide-based material of $Al_mGa_nInP$, where $0 \leq m \leq 1$ or $0 \leq n \leq 1$, said ohmic contact layer having an Al content that is less than an Al content of said window layer.

17. The light-emitting diode as claimed in claim 16, wherein said ohmic contact layer is n-type doped and has a doping concentration of greater than $4E+18/cm^3$, said window layer being n-type doped and having a doping concentration ranging from $4E+17/cm^3$ to $4E+18/cm^3$.

18. The light-emitting diode as claimed in claim 16, wherein a relation between $Al_xGa_yInP$ and $Al_mGa_nInP$ is $m-x \geq 0.2$, where m ranges from 0.2 to 1.0, x ranging from 0 to 0.8.

19. A light-emitting device, comprising a light-emitting diode as claimed in claim 1.

20. A method for manufacturing a light-emitting diode, comprising:

sequentially forming a light-emitting layer and a second-type semiconductor layer on a first-type semiconductor layer, so as to obtain an epitaxial structure having a first surface and a second surface opposite to the first surface, the first-type semiconductor layer including an ohmic contact layer which at least partially defines the first surface of the epitaxial structure;

forming a main electrode on the first surface of the epitaxial structure; and forming a plurality of auxiliary electrodes on the ohmic contact layer, the plurality of auxiliary electrodes each being spaced apart from the main electrode, wherein the ohmic contact layer is made of an indium phosphide-based material of $Al_xGa_yInP$, where $0 \leq x \leq 1$ or $0 \leq y \leq 1$, and wherein in a top view of the light-emitting diode, a projection of each of the plurality of auxiliary electrodes on the first surface is smaller than a projection of the ohmic contact layer on the first surface.

21. The method as claimed in claim 20, wherein the main electrode is formed on one of a first portion of the first surface which is defined by the ohmic contact layer and a second portion of the first surface of the epitaxial structure which is not covered by the ohmic contact layer.

* * * * *